(12) United States Patent
Dawes et al.

(10) Patent No.: US 11,852,975 B2
(45) Date of Patent: Dec. 26, 2023

(54) ELECTRON BEAM LITHOGRAPHY WITH DYNAMIC FIN OVERLAY CORRECTION

(71) Applicant: International Business Machines Corporation, Armonk, NY (US)

(72) Inventors: Simon Dawes, Mahopac, NY (US); Ernst Kratschmer, South Dennis, MA (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 784 days.

(21) Appl. No.: 16/923,232

(22) Filed: Jul. 8, 2020

(65) Prior Publication Data

US 2022/0013362 A1 Jan. 13, 2022

(51) Int. Cl.
*G03F 7/20* (2006.01)
*G03F 9/00* (2006.01)

(52) U.S. Cl.
CPC .............. *G03F 7/2061* (2013.01); *G03F 9/70* (2013.01)

(58) Field of Classification Search
CPC .................................................... G03F 7/2061
USPC ........................................................ 430/296
See application file for complete search history.

(56) References Cited

U.S. PATENT DOCUMENTS

| 6,159,644 A | 12/2000 | Satoh et al. |
| 6,225,011 B1 | 5/2001 | Gotoh et al. |
| 7,160,657 B2 | 1/2007 | Smith et al. |
| 7,427,459 B2 | 9/2008 | Chen |
| 2011/0253892 A1 | 10/2011 | Yamaguchi |

FOREIGN PATENT DOCUMENTS

| JP | 02087516 A | 3/1990 |
| JP | 11016817 A | 1/1999 |
| JP | 11135413 A | 5/1999 |
| JP | 11145049 A | 5/1999 |

*Primary Examiner* — Christopher G Young
(74) *Attorney, Agent, or Firm* — CANTOR COLBURN LLP; Joseph P. Curcuru

(57) ABSTRACT

An electron beam lithography (Ebeam) method for a wafer having alignment and device layers with a design alignment. The Ebeam method includes executing an Ebeam scan of predefined length and resolution based on the design alignment over a pattern edge of the device layer, generating a signal from reflections of the Ebeam scan off the pattern edge, determining an offset of the device layer relative to the alignment layer from a comparison of the signal and the design alignment and applying the offset to the design alignment to obtain an actual measurement of Ebeam alignment.

14 Claims, 3 Drawing Sheets

ELECTRON BEAM LITHOGRAPHY WITH DYNAMIC FIN OVERLAY CORRECTION

BACKGROUND

The present invention generally relates to electron beam lithography, and more specifically, to electron beam lithography with dynamic fin overlay correction.

Electron-beam lithography or e-beam lithography (EBL) is the practice of scanning a focused beam of electrons to draw custom shapes on a surface covered with an electron-sensitive film called a resist. The electron beam changes the solubility of the resist, enabling selective removal of either the exposed or non-exposed regions of the resist by immersion in a solvent. The purpose, as with photolithography, is to create very small structures in the resist that can subsequently be transferred to a substrate material.

SUMMARY

Embodiments of the present invention are directed to an electron beam lithography (Ebeam) method for a wafer having alignment and device layers with a design alignment. The Ebeam method includes executing an Ebeam scan of predefined length and resolution based on the design alignment over a pattern edge of the device layer, generating a signal from reflections of the Ebeam scan off the pattern edge, determining an offset of the device layer relative to the alignment layer from a comparison of the signal and the design alignment and applying the offset to the design alignment to obtain an actual measurement of Ebeam alignment.

Embodiments of the present invention are directed to an electron beam lithography (Ebeam) method for a wafer with multiple chips each having alignment and device layers with a design alignment. A non-limiting example of the Ebeam method includes executing an Ebeam scan of predefined length and resolution based on the design alignment over a pattern edge of the device layer of each of the multiple chips, generating signals from reflections of the Ebeam scan off each of the pattern edges, determining an offset of each of the device layers of each of the multiple chips relative to the corresponding alignment layer from comparisons of the signals and the design alignments and applying each of the offsets to the corresponding design alignment to obtain actual measurements of Ebeam alignment for each of the multiple chips.

Embodiments of the invention are directed to a system to execute an electron beam lithography (Ebeam) method for a wafer having alignment and device layers with a design alignment. A non-limiting example of the system includes a stage on which the wafer is disposable, an Ebeam scanner to execute an Ebeam scan of the wafer and a controller to execute a method. The method includes moving the stage whereby the wafer is disposed in a pattern edge position, controlling the Ebeam scanner to execute an Ebeam scan of predefined length and resolution based on the design alignment over a pattern edge of the device layer, generating a signal from reflections of the Ebeam scan off the pattern edge, determining an offset of the device layer relative to the alignment layer from a comparison of the signal and the design alignment and applying the offset to the design alignment to obtain an actual measurement of Ebeam alignment.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

Figure 1:
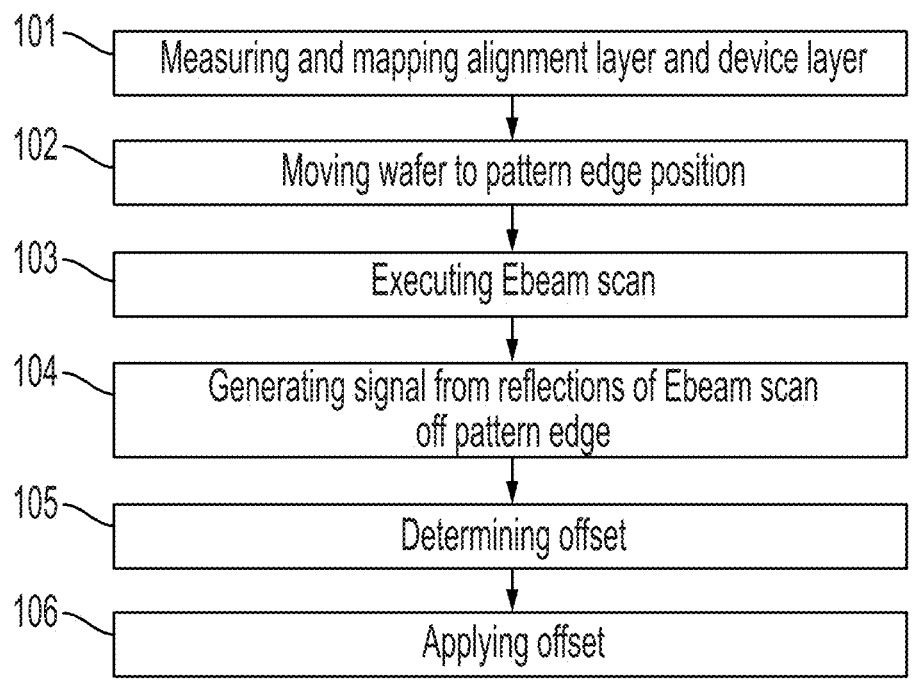
FIG. 1 is a flow diagram illustrating an electron beam lithography (Ebeam) method for a wafer having alignment and device layers with a design alignment in accordance with one or more embodiments of the present invention.

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the disclosed embodiments, the various elements illustrated in the figures are provided with two or three-digit reference numbers. With minor exceptions, the leftmost digit(s) of each reference number correspond to the figure in which its element is first illustrated.

DETAILED DESCRIPTION

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

Turning now to an overview of technologies that are more specifically relevant to aspects of the invention, electron beam lithography (Ebeam) pattern exposure overlay of less than 20 nm in an X direction (in an X-Y plane) that spans up to twenty chips or more across a wafer (e.g., an eight inch wafer) is typically required for optimum device performance and high wafer yield. In these or other cases, a stepper/scanner mask set is used to expose chip alignment marks and the device patterns are often individual masks, where each mask is exposed individually by the stepper/scanner without alignment due to processing requirements for each layer. This can result in stepper/scanner pattern placement error variation between the alignment mark layer and the device pattern layer of up to 150 nm. However, because Ebeam pattern exposure overlay alignment is at least partially dependent on positional accuracy of the alignment mark layer with respect to the device pattern layer, the Ebeam pattern exposure overlay alignment can therefore be compromised and randomized due to individual stepper/scanner mask exposure pattern placement errors. This issue is particularly relevant where positional errors between the alignment mark layer and the device pattern layer are unknown to the Ebeam apparatus in use.

Previous attempts to reduce Ebeam overlay errors involved the measurement of chip overlay positions. Due to the non-linearity and large overlay error variation from chip to chip and wafer to wafer, however, use of a single pattern offset value proved inadequate. The same process was then applied to multiple wafers where each wafer overlay offset was measured on a per wafer basis. Again, this proved inadequate as chip to chip and sub-chip to sub-chip overlay error variation was too large.

Turning now to an overview of the aspects of the invention, one or more embodiments of the invention address the above-described shortcomings of the prior art by providing a device pattern layer that is highly visible in the Ebeam with very good secondary and back scattered electron contrast and a fully autonomous process requiring Ebeam job control programming and signal analysis coding. This enables the Ebeam to accurately measure a position of the device pattern layer with respect to the alignment mark layer after standard Ebeam alignment processing and after application of the Ebeam standard alignment correction mapping, which corrects for chip and sub-chip scale, rotation, position and keystone errors.

The above-described aspects of the invention address the shortcomings of the prior art by accurately measuring a device pattern layer position within a few nanometers and by "on the fly" application of a position error as an Ebeam pattern position offset just prior to each Ebeam pattern exposure for each chip and sub-chip Ebeam alignment map. In accordance with embodiments of the present invention, however, the Ebeam processing described herein with dynamic fin overlay correction can result in 100% device yield, substantially reduced wafer rework and increased throughput by more than 70%.

Figure 2:
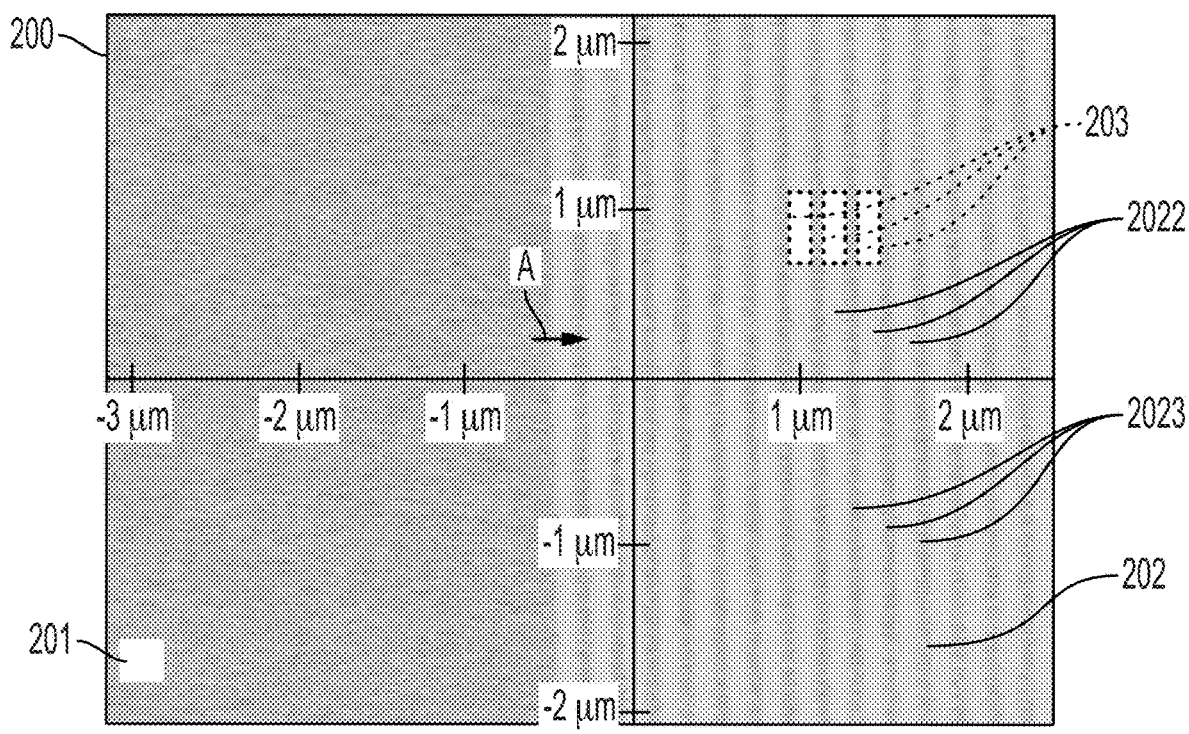
FIG. 2 is a graphical depiction of an execution of an Ebeam scan in accordance with one or more embodiments of the present invention.

Turning now to a more detailed description of aspects of the present invention, FIG. 1 depicts an electron beam lithography (Ebeam) method 100 for forming a wafer 200 shown in FIG. 2. As shown in FIG. 2, the wafer 200 includes an alignment layer 201 and a device layer 202 with a design alignment between the alignment layer 201 and the device layer 202 that is derived from a computer-aided design (CAD) file of the wafer 200. A second device layer 203 is overlaid on a series of vertical lines 2022 and spaces 2023 of the device layer 202.

Normally, if an Ebeam pattern exposure, such as the second device layer 203, is required to be accurately placed (or exposed) on patterned layers that are already provided on a wafer, such as the device layer 202, the use of alignment marks on the alignment layer 201 is often required where these alignment marks are accurately placed relative to the device layer 202. Typically, exact positions of the alignment marks of the alignment layer is known from CAD drawings. The Ebeam then accurately locates the position of the alignment marks of the alignment layer 201 and therefore uses known relative position of the device layer 202 from the alignment marks so that the Ebeam can in turn expose the second device layer 203.

An optical stepper tool can be used to expose both the alignment marks of the alignment layer 201 and the device layer 202 using a single mask in one exposure to obtain an accurate positional relationship between the alignment mark and the device layer 202 with a positional accuracy of just a few nanometers. In some cases, however, it is not possible to use an optical stepper mask exposure for both the alignment marks 201 and the device layer 202. As a compromise, in these cases, the alignment marks and device layer 202 can be exposed individually. This inherently introduces relatively large positional errors between the alignment marks and the device layer 202. The positional accuracy can vary between ±150 nm across the wafer from chip-to-chip and from wafer-to-wafer.

It is therefore not possible to achieve an overlaid exposure of the second device layer 203 on the device layer 202 with a positional accuracy of less than 20 nm due to the inaccurate positions of the alignment marks relative to the device layer 202. As such, the following description relates to the finding of alignment marks in the alignment layer 201 and the using of an Ebeam scan to accurately measure the actual position of the device layer 202. Then, with the Ebeam scan having measured the actual physical position of the device layer 202 relative to the alignment marks, a difference in actual position versus the CAD drawing position can be calculated. This difference can be applied as a pattern placement offset when exposing the pattern.

As shown in FIG. 1, the Ebeam method 100 includes at block 101 measuring and mapping the alignment layer 201 and the device layer 202 according to known methods. At block 102, the wafer 200 is moved to a pattern edge position that is determined in accordance with the CAD file and based on results of the measuring and mapping at block 101. The method 100 further includes at block 103 executing an Ebeam scan of predefined length and resolution based on the design alignment and, more particularly, based on the results of the measuring and mapping, over a pattern edge of the device layer (the Ebeam scanning length and direction are illustrated in FIG. 2 by the arrow A).

Figure 3:
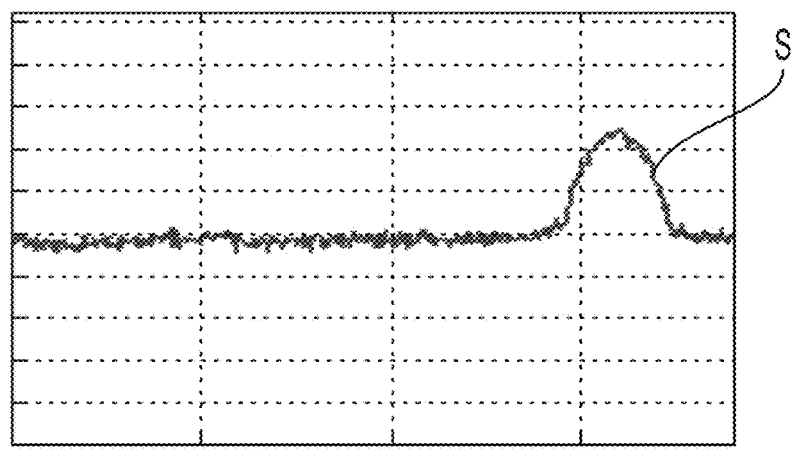
FIG. 3 is a graphical depiction of a signal derived from the Ebeam scan of FIG. 2 in accordance with one or more embodiments of the present invention.

In addition, with continued reference to FIG. 1 and with additional reference to FIG. 3, the method 100 includes at block 104 generating a signal S from reflections of the Ebeam scan off the pattern edge. At block 105, an offset of the device layer relative to the alignment layer is determined from a comparison of the signal and the design alignment. At block 106, the offset is applied to the design alignment to obtain an actual measurement of Ebeam alignment.

The wafer 200 (shown in FIG. 2) can include multiple chips with each chip having alignment and device layers with a design alignment. The method 100 can thus be applied to each of the multiple chips separately or interdependently. The following description will generally relate to the case of the chip being singular on the wafer unless otherwise noted. This is being done for purposes of clarity and brevity.

Figure 4:
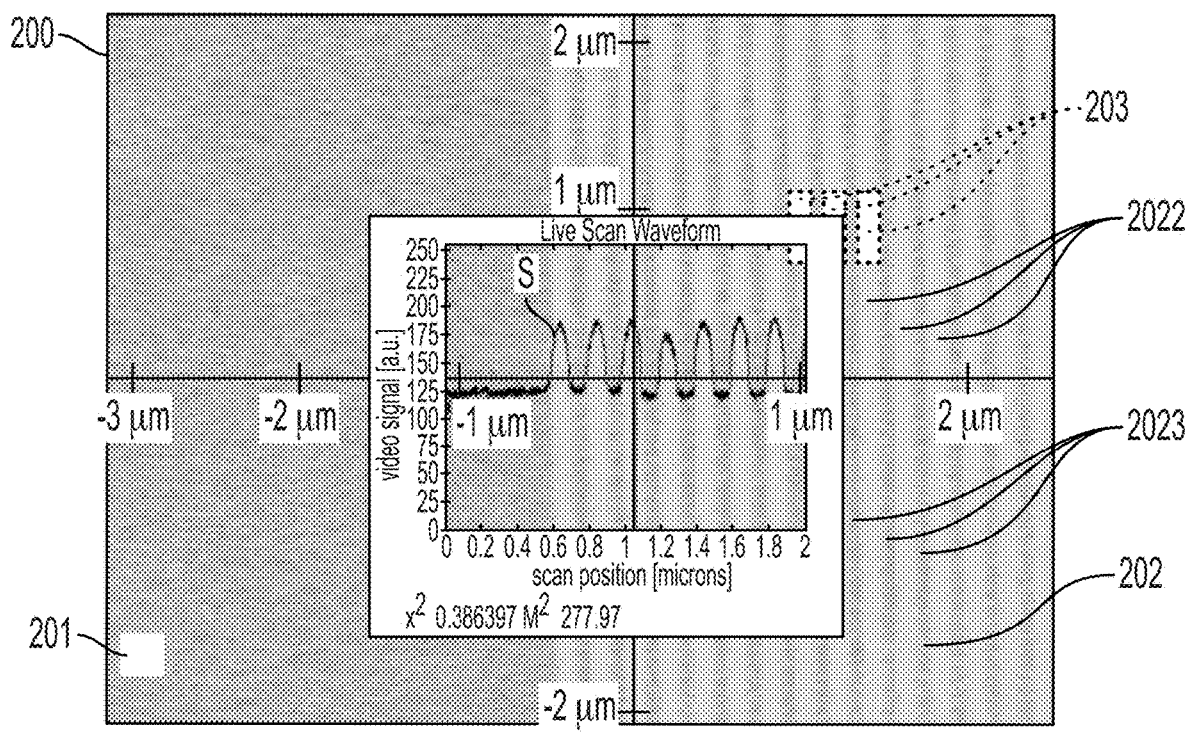
FIG. 4 is a graphical depiction of a signal derived from an extended Ebeam scan in accordance with one or more embodiments of the present invention.

With reference to FIG. 4, the executing of the Ebeam scan of block 103 (shown in FIG. 1) can include executing an Ebeam scan over multiple pattern edges of the device layer 202 and the generating of the signal S of block 104 (shown in FIG. 1) can include averaging out readings from each of the pattern edges.

In greater detail, for an Ebeam method to measure pattern placement, the device layer 202 must be visible to the Ebeam and capable of reflecting electrons from the incident electron beam. These reflected electrons are used to generate the signal S of operation 104 as a video signal. The device layer 202 provides suitable video contrast (low video to high video signal transitions between the vertical lines 2022 and the spaces 2023) in order for the Ebeam scan to detect edges of the pattern of the device layer 202.

After the design alignment has been measured and mapped in operation 101, the wafer is moved using an X-Y interferometer stage (to be described below) to a pattern edge position whereupon an electron beam scan of an exact length (i.e., the predefined length and at the predefined resolution) is scanned over the pattern edges. In some cases, several pattern edges can be used to average out distortion and critical dimension (CD) errors inherent in the device layer 202. For example, seven vertical lines 2022 and seven spaces 2023 of the device layer 2022 can be scanned so that six edges (i.e., three vertical lines 2022 and three spaces 2023) can be developed.

The Ebeam scan can be made up from individual Ebeam "pixels" at a resolution specified in position offset measurement command parameters. For example, where a resolution of 5 nm is used, the Ebeam scan can include 400 pixels (i.e., 2 μm (2000 nm) divided by 5 nm) where each pixel is 5 nm. A fast, basic video signal smoothing algorithm can then be applied followed by a calculation of line edge positions based on the position of the pattern line edge video transitions relative to the scan position as shown in FIGS. 2-4. The line edge positions provide exact positions of the device layer 202 with respect to error corrected mapped alignment mark positions. The correct position of the device layer 2022 edges from the CAD file is already known. Thus, subtracting the Ebeam measured device layer 202 position from the CAD file position provides an offset value to apply to the Ebeam exposed overlay pattern.

The offset measurement and application routine can be conducted for every chip and sub-chip on an eight-inch wafer (twenty chips with six sub-chips per chip totaling 120 offset measurements per wafer).

The measurement and application of pattern overlay offsets is extremely fast and requires less than one second per measurement, which adds very little overhead to the complete wafer exposure. The method can result in 100% device yield, substantially reduced wafer rework and increased throughput by more than 70%.

Figure 5:
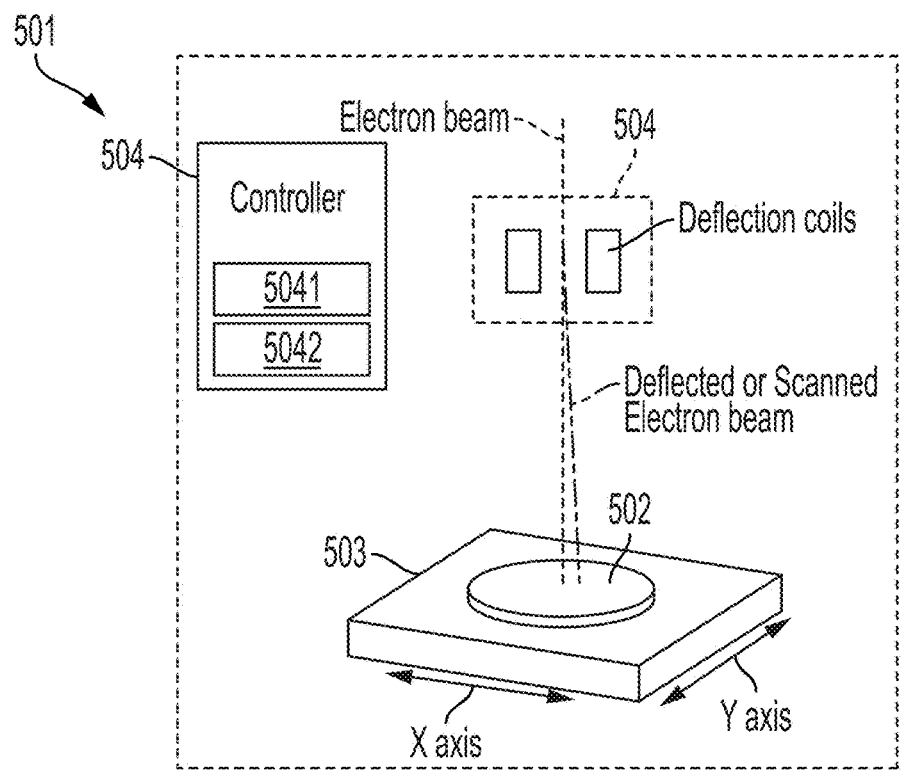
FIG. 5 is a schematic illustration of a system for executing an Ebeam lithography method in accordance with one or more embodiments of the present invention.

With reference to FIG. 5, a system 501 is provided to execute an Ebeam method for a wafer 502 having alignment and device layers with a design alignment as described above. The system 501 includes a stage, such as an X-Y interferometer stage 503 on which the wafer 502 is disposable, an Ebeam scanner 504 which applies precisely controlled current to the electro-magnetic deflection coils to execute an Ebeam scan of the wafer 502 and a controller 504. The controller 504 can include a processing unit 5041 and a memory unit 5042 on which executable instructions are stored. The executable instructions are readable and executable by the processing unit 5041 such that, when the processing unit 5041 reads and executes the executable instructions, the processing unit 5041 is caused to execute the method 100 of FIG. 1 described above.

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" can be understood to include any integer number greater than or equal to one, i.e. one, two, three, four, etc. The terms "a plurality" can be understood to include any integer number greater than or equal to two, i.e. two, three, four, five, etc. The term "connection" can include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instruction by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. An electron beam lithography (Ebeam) method for a wafer having alignment and device layers with a design alignment, the Ebeam method comprising:
   executing an Ebeam scan of predefined length and resolution based on the design alignment over a pattern edge of the device layer;
   generating a signal from reflections of the Ebeam scan off the pattern edge;
   determining an offset of the device layer relative to the alignment layer from a comparison of the signal and the design alignment; and
   applying the offset to the design alignment to obtain an actual measurement of Ebeam alignment.

2. The Ebeam method according to claim 1, wherein the design alignment is derived from a computer-aided design (CAD) file of the wafer.

3. The Ebeam method according to claim 1, wherein the device layer is visible to and reflective of an electron beam of the Ebeam scan.

4. The Ebeam method according to claim 1, wherein:
   the device layer comprises vertical lines and spaces; and the signal comprises a video signal with vertical line-space contrasts.

5. The Ebeam method according to claim 1 further comprising:
    measuring and mapping the alignment and device layers; and
    moving the wafer to a pattern edge position based on results of the measuring and mapping prior to the executing of the Ebeam scan.

6. The Ebeam method according to claim 5, wherein the predefined length and resolution are based on the results of the measuring and mapping.

7. The Ebeam method according to claim 1, wherein:
    the executing of the Ebeam scan comprises executing Ebeam scans over multiple pattern edges of the device layer; and
    the generating of the signal comprises averaging out readings from each of the Ebeam scans.

8. An electron beam lithography (Ebeam) method for a wafer with multiple chips each having alignment and device layers with a design alignment, the Ebeam method comprising:
    executing an Ebeam scan of predefined length and resolution based on the design alignment over a pattern edge of the device layer of each of the multiple chips;
    generating signals from reflections of the Ebeam scan off each of the pattern edges;
    determining an offset of each of the device layers of each of the multiple chips relative to the corresponding alignment layer from comparisons of the signals and the design alignments; and
    applying each of the offsets to the corresponding design alignment to obtain actual measurements of Ebeam alignment for each of the multiple chips.

9. The Ebeam method according to claim 8, wherein the design alignment of each of the multiple chips is derived from a computer-aided design (CAD) file of the wafer.

10. The Ebeam method according to claim 8, wherein the device layer of each of the multiple chips is visible to and reflective of an electron beam of the corresponding Ebeam scan.

11. The Ebeam method according to claim 8, wherein:
    the device layer of each of the multiple chips comprises vertical lines and spaces; and
    the signal associated with each of the multiple chips comprises a video signal with vertical line-space contrasts.

12. The Ebeam method according to claim 8 further comprising:
    measuring and mapping the alignment and device layers of each of the multiple chips; and
    moving the wafer to a pattern edge position of each of the multiple chips based on results of the corresponding measuring and mapping prior to the executing of the corresponding Ebeam scan.

13. The Ebeam method according to claim 12, wherein the predefined length and resolution are based on the results of the measuring and mapping.

14. The Ebeam method according to claim 8, wherein:
    the executing of the Ebeam scan comprises executing Ebeam scans over multiple pattern edges of each of the device layers; and
    the generating of the signal comprises averaging out readings from each of the pattern edges.

* * * * *